United States Patent [19]

Frijlink

[11] Patent Number: 4,961,399
[45] Date of Patent: Oct. 9, 1990

[54] EPITAXIAL GROWTH REACTOR PROVIDED WITH A PLANETARY SUPPORT

[75] Inventor: Peter M. Frijlink, Crosne, France

[73] Assignee: U.S. Philips Corporation, New York, N.Y.

[21] Appl. No.: 323,468

[22] Filed: Mar. 14, 1989

[30] Foreign Application Priority Data

Mar. 22, 1988 [FR] France .................... 88 03688

[51] Int. Cl.$^5$ ............................................ C23C 16/00
[52] U.S. Cl. ............................ 118/730; 118/715; 118/725; 156/611
[58] Field of Search ............. 118/715, 719, 725, 730; 156/610, 611, 614; 427/255.5

[56] References Cited

U.S. PATENT DOCUMENTS 4,047,496 9/1977 McNeilly et al. .................. 118/730

FOREIGN PATENT DOCUMENTS

| 56-49518 | 5/1981 | Japan | 118/730 |
| 60-74509 | 4/1985 | Japan | 118/715 |
| 61-86498 | 5/1986 | Japan | 118/730 |
| 62-228478 | 10/1987 | Japan | 118/715 |
| 62-238365 | 10/1987 | Japan | 118/715 |

*Primary Examiner*—Richard Bueker
*Assistant Examiner*—Terry J. Owens
*Attorney, Agent, or Firm*—Paul R. Miller

[57] ABSTRACT

An epitaxial reactor for processing a plurality of semiconductor material wafers by exposing them to a reactive gaseous flow is provided with a support of the planetary type. The vessel in which the reactive gasses are in contact with the wafers (1) is constituted by a cylindrical member (19) having a vertical axis and which surrounds the planetary wafer support (3, 4, 5) as closely as possible. The cylindrical member is hermetically sealed at its lower and upper sections by a bottom formed by a plate (7) and a top formed by a plate (8), and a roughly flat cover (9) covers this arrangement. An inlet aperture for the reactive gas is located in the center of the cover, opposite the center of the planetary support. This central aperture has for its object to introduce the reactive gasses discharging into the vessel via several concentric funnels (26, 27, 28), whose flared ends face downwardly.

13 Claims, 1 Drawing Sheet

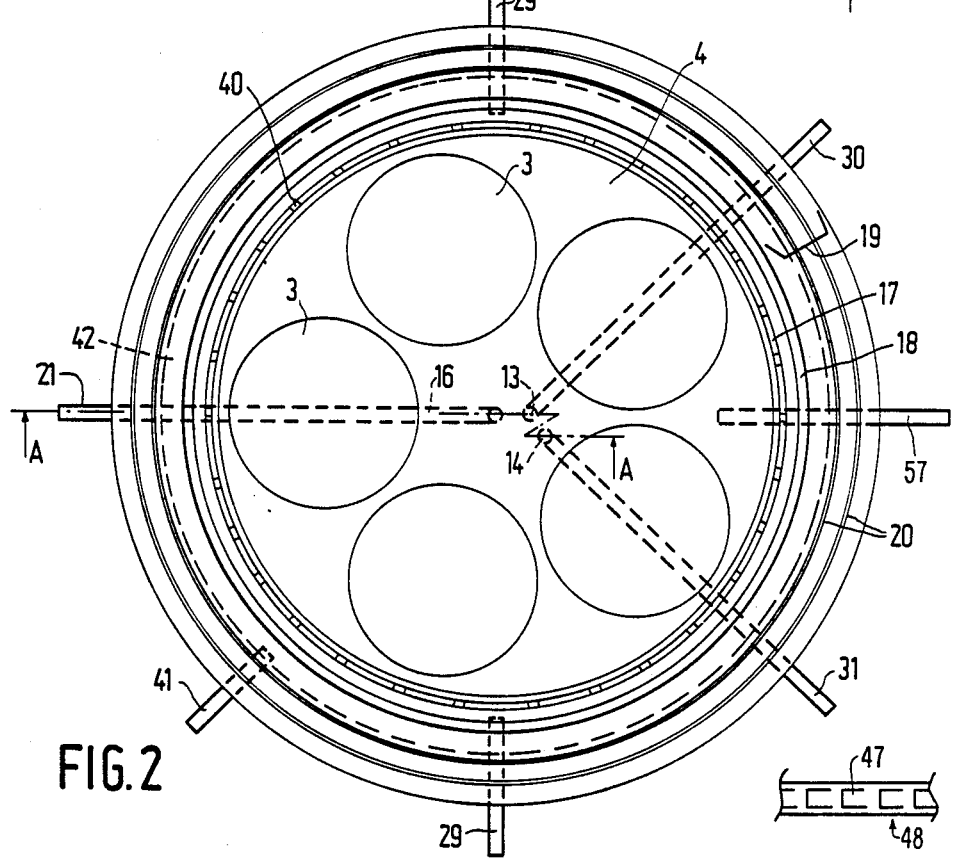

EPITAXIAL GROWTH REACTOR PROVIDED WITH A PLANETARY SUPPORT

The present invention relates to an epitaxial growth reactor for processing a plurality of wafers of a semiconductor material by exposing them to a reactive gaseous flow, provided with a planetary support, i.e. a support comprising means for causing a plurality of disks to rotate in a general motion around an axis while furthermore causing them to rotate around themselves, each disk carrying a wafer during growth.

BACKGROUND OF THE INVENTION

Such a wafer support, which is alternatively denoted a "sample support" is disclosed in the document French patent application FR-A-2,596,070, which describes in detail a support, disks and means for causing the disks to rotate.

This document does not deal with the following problem: such a support has rather large dimensions, which requires a reactor vessel of a corresponding size. Usually a cylindrical or rectangular tube made of quartz is used as the epitaxial reactor which is positioned such that its axis is horizontal and that the reactive gaseous flow is introduced it, which gas propagates parallel to the walls of the cylinder, and has the advantage that it is possible to obtain a homogeneous laminar reactive gas flow producing depositions of uniform widths. But with a support whose main disk has, for example, a diameter of 25 cms, a quartz tube of the appropriate size to accomodate the device is extremely expensive. In addition, loading or unloading the wafers via the end of the quartz cylinder is not easy, and requires a mechanical means for removing sealing members.

SUMMARY OF THE INVENTION

The invention provides a reactor whose vessel is much more compact and much cheaper than that obtained by using a quartz tube. It permits processing several wafers simultaneously without opening the vessel and to obtain a proper uniformity in the width of the depositions.

To this effect, the vessel in which the reactive gasses are in contact with the wafers during growth is formed by a cylindrical member having a vertical axis which almost surrounds the planetary support, a bottom formed by a plate and a substantially flat cover being sealed to the lower and higher sections of this cylindrical support.

The document U.S. Pat. No. 3,721,210 describes a reactor which, although it does not include a planetary support permitting the simultaneous processing of several wafers, it nevertheless renders it possible to process a plurality of wafers without the vessel being opened, and without the use of a very expensive quartz tube. In this reactor, the main disc is only used for holding the wafer, it is stationary during the epitaxial growth, and is put into motion to convey the wafers into the space subjected to the reactive gaseous flow, or to withdraw them therefrom. Because the wafers are processed one after the other, the processing cycle is long. Moreover, this document describes only very scanty means to obtain a best possible uniformity for the width of the resultant depositions, which is one of the technical problems solved by the present invention. According to the present invention, an excellent uniformity of the width of the deposition across the overall width of the surface of a wafer can be obtained when an orifice for passing reactive gasses is situated in the center of the cover, opposite the center of the main disk.

In addition, in certain operating stages, it is necessary to introduce several gasses which are liable to react very rapidly with each other. This is, for example, the case with arsine with triethyl-indium. They should, therefore, not be mixed in advance, and they are to be introduced simultaneously but separately into the vessel. To this end the central aperture serves to introduce the reactive gasses and discharges into the vessel via several concentric funnels whose flared portions face downwardly.

This arrangement renders it possible to provide that the different gaseous flows do not mix very rapidly during their radial travel toward the exterior of the vessel, which would otherwise cause a granular and abundant deposit in the center of the vessel. This is harmful in spite of the rotation of the wafers about a wafer axis. Moreover, a cylindrical grid is advantageously located in the annular space by which the largest funnel discharges into the vessel. This grid is, for example, formed by tangential ribs in the cylindrical section of the grid structure. In addition, the lower part of the conical wall which separates the two annular gas inlet spaces from each other, located at the farther side, is advantageously extended by a substantially flat and horizontal ring. All these arrangements cooperate to improve the uniformity of the depositions on the overall wafer surface to a still greater extent. Moreover, when the reactor is used to deposit so-called Group III-V compounds, the central funnel is used to introduce the Group V compounds and the outer funnel for the Group III compounds. This feature, together with the features described in the foregoing, renders it possible to provide that the quantity of gas containing the Group V compound is always greater than the further constituents on the surfaces of the wafers.

To improve the uniformity of the radial reactive gas flow still more, the planetary support is directly surrounded, in the interior of the cylindrical vessel, by a rim made of a quartz ring provided with equidistant apertures along its circumference and having an outside provided with an annular gas circulation space.

A further important advantage of the arrangement according to the invention is the ease of loading or unloading the semiconductor wafers to be processed. The reactor can be opened from below, providing a direct access to the wafer station. So as to benefit to the highest possible extent of this advantage and to provide a still faster action for opening the vessel, the cover is not secured by a set of peripheral bolts but is placed on the cylindrical member by a system of jacks which render it possible to remove the cover for loading or unloading the reactor.

BRIEF DESCRIPTION OF THE DRAWINGS

The following description given by way of example with reference to the accompanying drawings, will make it better understood how the invention can be put into effect.

FIG. 1 is a side sectional view of half a reactor (along the line AA of FIG. 2) according to the invention.

FIG. 2 is a plan view of the same reactor with open cover, at a scale reduced to approximately half the scale of FIG. 1.

FIGS. 3a and 3b are a plan view of a part of the reactor and a partial side view of the reactor.

In order to provide a drawing at a larger scale, FIG. 1 shows not more than approximately half the reactor. It will be easy to derive the portion not shown from the components shown in FIG. 2.

DESCRIPTION OF PREFERRED EMBODIMENTS

The wafer support is formed by a graphite disk 5 in which gas supply channels 13, 14, 16 are formed and whose upper portion is hollowed out to form a cuvette. A main disk 4 having a diameter of approximately 25 cms and which rotates while floating on a gas bed is arranged in this cuvette and this disk carries a plurality of secondary disks 3 which also rotate floating on a gas bed, and on each of which a semiconductor wafer or slice 1 is placed. A gas supply tube of which only the end is shown at 13 since it is not included in the plane of the sectional view, conveys the floating gas (consisting of hydrogen) to under the main disk 4. A further tube 16 ends in the center of the fixed plate 5 facing an end of the pipe 15 which is located inside the rotating main disk 4 and ends below the secondary disk 3.

The disks 4 and 5 are provided with spiral-shaped channels which cause a rotational component of the gas causing the supported disks to rotate. A channel collecting the gasses and conveying them towards the lower disk is provided below each rotating disk. This is described in greater detail in the document French patent application FR-A-2, 596,070 mentioned in the preamble, which is to be considered as included in the present description by reference.

The size of the main disk allows the placing of, for example, 5 secondary disks each carrying a wafer having a diameter of 7.62 cms or 7 secondary disks each carrying a wafer having a diameter of 5.08 cms. The secondary disk has a thickness of approximately 5 mm, the main disk 4 has a thickness of approximately 12 mm, and together with the fixed supporting disk 5 the overall thickness is approximately 28 mm. All these components are made of graphite.

The reactor vessel is constituted by a cylindrical member 19 having a vertical axis 32 of a circular cross-section onto which a cover 8 and a bottom 7 still to be described hereinafter are hermetically sealed. This member 19 tightly envelops the disks 4 and 5, so as to limit the volume to be heated and the required volumes of reactive gasses to a maximum extent. The height of the member 19 is chosen in such manner as to leave a space 2 of an appropriate height for allowing the reactive gasses to pass, above the graphite support 3, 4, 5. In this space the wafers 1 are in contact with the reactive gasses.

This member is cooled by a coil formed by tubes 12 soldered thereto and through which water circulates. The member is made of stainless steel. It has an internal groove 42 winding around it which is closed by a cylindrical quartz wall 18 which covers the overall internal surface of the cylindrical member 19. Hydrogen is fed into the groove 42 via a tube 41 (FIG. 2) and penetrates into the vessel escaping through the spacing between the steel member 19 and the quartz rim 18, so as to prevent reaction products from penetrating there and contaminating the member 19. The floating gas for the wafer support system is supplied via a tube 21 which crosses through the cylindrical member 19 and the rim 18 and penetrates into the graphite block 5.

The bottom of the reactor is constituted by a simple round quartz plate 7 about 4 mm thick. The hermetic seal is ensured by 2 O-rings 44 between which a groove 43 is formed which is evacuated.

The wafer suppport system is placed on the bottom 7 by means of graphite blocks 6, which provide a space for the evacuation of the floating gas. In addition, a tube ending at 14 and whose aperture points downwards towards the fixed disk 5 injects hydrogen into this space so as to prevent the reactive gasses from reaching the disk and from forming deposits there.

Under the bottom 7 infra-red lamps 58 are disposed which are fitted with reflectors 59, producing infra-red radiation which passes along the bottom 7 and heats the graphite support. The use of a plurality of lamps enables modulation of their relative power to obtain a perfect uniformity of heating from the center to the side of the disk.

The cover is constituted by a quartz disk 8 whose thickness is approximately 4 mm, applied on the O-rings 20 between which a groove 33 is made similar to the groove 43 at the lower portion. This cover is roughly flat, i.e. it is flat with the exception of its midway point which is raised to form a funnel 28. Gas can be fed into this funnel via the tube 38. Within the funnel 28 two further concentric volumes 26 and 27 are provided whose lower part is in the shape of a funnel whose flared end points downwards. Each of the volumes 26 and 27 are in connection with a gas source via tubes 36, 37, respectively. This set of three concentric funnels is made of quartz and the exterior funnel forms one integral whole with the cover 8. The lower part of the pieces 26 and 27 is located approximately 2 mm below the main disk 4. The inner tube 36 permits feeding, for example, arsenide $AsH_3$ prediluted in hydrogen, and the exterior conduit 38 can convey a mixture of an organo-metal substance diluted in hydrogen.

To prevent that the distribution of the gas flow, which is uniform in all the directions in the horizontal plane, is not stable, a cylindrical grid 48 is placed in the annular space through which the funnel 28 discharges into the vessel. This grid is shown separately in FIG. 3a, in a plan view. To the right on FIG. 3b a piece of the grid is shown again, in a side view; and it is a flat molybdenum strip 48 in which U-shaped cuts are made by laser to form tongues 47. When the strip material is wound to form a cylinder, the tongues remain flat and tangential to the section of the cylinder obtained, as is shown at 49 in FIG. 3a. They form ribs which give the gasses an flowout rate which is approximately tangential to the cylinder. Because of the fact that each rib is swept at the inside by the fresh gas leaving the preceding rib, no contaminating deposit is produced.

Moreover, the lower part of the conical wall separating the two annular gas inlet spaces 27, 28 from each other, situated farthest to the exterior, is extended by a substantially flat and horizontal rib 45. This rib 45 is made of molybdenum and is in two parts to facilitate mounting. It can, for example, be secured to the grid 48 by any known means. It should be noted when observing this rib 45 in FIG. 1, that it separates from each other, on the one hand the gas flows leaving the space 26 and, on the other hand, those leaving the spaces 27, 28 delaying their mixing together and rendering their rate of flow horizontal, so as to avoid turbulences.

This rib 45 might alternatively be constituted by a flattened portion of the quartz edge of the funnel wall located between the spaces 27 and 28.

The cover 8 is held by a metal piece 9 which causes it to bear against the cylindrical member 19. Between the metal piece 9 and the disk 8 a space 34 is made which, to control the cover temperature, can be filled with gas via the tubes 10, 11 and whose hermetical seal is realized with the aid of O-rings 22, 23, 24. The annular piece 25 which is capable of sliding somewhat relative to the piece 9 has for its object to prevent the quartz cover from breaking during mounting. The metal piece 9 is cooled by means, not shown, which may, for example, be water pipes similar to the tubes 12, or hollow channels which are made in the piece and are filled with water.

The assembly of the components constituting the cover can be lifted to allow access to the interior of the reactor. A system is provided for resting this assembly on the member 19 and also to lift it therefrom. This has not been shown for simplicity of the drawing, but it can easily be realized by any known mechanical means. By way of example, the component 9 can be provided with ball sleeves sliding around vertical tubes and consequently permitting a vertical translating motion, this motion being controlled by one or a plurality of hydraulic jacks.

In order to increase the uniformity of the distribution of the gas mixtures along the axis 32, the wafer support is surrounded by a quartz ring 17 provided with apertures, here in the form of vertical slits 40 which are provided equidistantly around its circumference. Between this ring 17 and the ring 18 there is an annular space in which two diametrically opposite tubes 29 end (FIG. 2) via which the reactive gasses can be discharged.

In FIG. 2, which shows the reactor cover in its lifted position, the arrangement of the various tubes passing through the member 19 is shown. The floating-gas feed tube 21 which discharges into the graphite block 5, the tube 31 ending at 14 to blow gas below the wafer support assembly, the tube 30 ending at 13 to supply the floating gas of the main disk, the hollow tube 16 in the fixed portion of the wafer support and supplying gas for the secondary disks, the tube 41 feeding gas into the annular groove 42, the reactive-gas discharge tubes 29, and a tube 57 which is closed at its end and penetrates into the fixed portion of the wafer support and allows the introduction of a thermocouple to measure the temperature. The main disk shown here carries five secondary disks 3 having a diameter of 7.62 cms.

In a variation of the invention, the cylindrical support 19 might alternatively be, for example, square instead of round, which would not change the behaviour of the gaseous flows provided the exterior ring 18 is maintained.

I claim:

1. An epitaxial growth reactor for processing wafers of semiconductor material comprising
    (a) a fixed support member,
    a rotating support member disposed on said fixed support member, and a plurality of disks, said rotating support member being rotatable and each of said disks supporting a semiconductor wafer, said plurality of disks being disposed on said rotating support member, and each of said plurality of disks being rotatable about individual axes through a center of each disk;
    (b) a reactor vessel having a cylindrical member with a circular cross-section surrounding said fixed support member, said rotating support member, and said plurality of disks, said cylindrical member having a vertical axis, said vertical axis extending through a center of said rotating support member, said cylindrical member having a height to provide a space above said plurality of disks to circulate reactive gasses to said semiconductor wafers;
    (c) a bottom plate hermetically sealed to a bottom of said cylindrical member;
    (d) a cover hermetically sealed to a top of said cylindrical member, said cover being flat over a substantial portion of a periphery of said cover;
    (e) a plurality of concentric funnels disposed into said cylindrical member at a center portion of said cover, said funnels being concentric about said vertical axis, and said funnels providing said reactive gasses into said cylindrical member above said semiconductor wafers; and
    (f) means for uniformly mixing and distributing said reactive gasses over said semiconductor wafers in a direction of a horizontal plane.

2. A reactor according to claim 1, wherein two of said concentric funnels flare into said space above said plurality of disks at different heights and a horizontal rim member is disposed at ends of the flaring funnels to render flow of said reactor gasses horizontal, to delay mixing of said reactive gasses, and to prevent turbulences.

3. A reactor according to claim 2, wherein said means for uniformly mixing and distributing said reactive gasses includes a cylindrical grid structure surrounding said concentric funnels, said reactor gasses flowing over said semiconductor wafers to said cylindrical grid structure, and wherein said cylindrical grid structure includes a plurality of tongues extending outwardly and tangentially to said cylindrical grid structure to enable said reaction gasses to flow outwardly for evacuation from said cylindrical member.

4. A reactor according to claim 3, wherein epitaxial layers of Group III-V compounds are grown on said semiconductor wafers, and wherein a central funnel of said plurality of concentric funnels introduces a reactive gas of Group V compound, and an exterior funnel introduces a reactive gas of Group III compound.

5. A reactor according to claim 4, wherein said cover and said plurality of concentric funnels are formed integrally of quartz.

6. A reactor according to claim 5, wherein said fixed support member, said rotating support member and said plurality of disks are directly surrounded with a quartz rim structure at an interior side of said cylindrical member, said quartz rim structure having uniformly distributed apertures along a circumference and an annular gas circulation space at an outward side.

7. A reactor according to claim 1, wherein said means for uniformly mixing and distributing said reactive gasses includes a cylindrical grid structure surrounding said concentric funnels, said reactor gasses flowing over said semiconductor wafers to said cylindrical grid structure, and wherein said cylindrical grid structure includes a plurality of tongues extending outwardly and tangentially to said cylindrical grid structure to enable said reaction gasses to flow outwardly for evacuation from said cylindrical member.

8. A reactor according to claim 1, wherein epitaxial layers of Group III-V compounds are grown on said semiconductor wafers, and wherein a central funnel of said plurality of concentric funnels introduces a reactive gas of Group V compound, and an exterior funnel introduces a reactive gas of Group III compound.

9. A reactor according to claim 1, wherein said cover and said plurality of concentric funnels are formed integrally of quartz.

10. A reactor according to claim 1, wherein said fixed support member, said rotating support member and said plurality of disks are directly surrounded with a quartz rim structure at an interior side of said cylindrical member, said quartz rim structure having uniformly distributed apertures along a circumference and an annular gas circulation space at an outward side.

11. A reactor according to claim 1, wherein said cover is positioned on said cylindrical member by a system of jacks, said jacks lifting and lowering said cover to load and unload semiconductor wafers from said plurality of disks.

12. A reactor according to claim 1, wherein said bottom plate is quartz, and wherein intra-red radiation source means are disposed under said bottom plate for heating said semiconductor wafers.

13. A reactor according to claim 1, wherein a plurality of gas feeds are disposed into said cylindrical member for using gas to float said rotating support member and said plurality of disks and to prevent said reaction gasses from contamination said fixed support member, said rotating support member, and said plurality of disks.

* * * * *